(12) United States Patent
Lin

(10) Patent No.: US 8,148,824 B2
(45) Date of Patent: Apr. 3, 2012

(54) SEMICONDUCTOR DEVICE WITH THROUGH SUBSTRATE VIA

(75) Inventor: Shian-Jyh Lin, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 162 days.

(21) Appl. No.: 12/761,413

(22) Filed: Apr. 16, 2010

(65) Prior Publication Data

US 2011/0254169 A1    Oct. 20, 2011

(51) Int. Cl.
 *H01L 23/48* (2006.01)
(52) U.S. Cl. . 257/774; 257/621; 257/698; 257/E21.158; 257/E21.597
(58) Field of Classification Search .......... 257/773–774, 257/621, 698, E21.158, E21.597, E23.011
See application file for complete search history.

(56) References Cited

U.S. PATENT DOCUMENTS

| | | | | |
|---|---|---|---|---|
| 6,790,775 | B2 * | 9/2004 | Fartash | 438/667 |
| 6,841,469 | B2 * | 1/2005 | Sawada et al. | 438/629 |
| 7,141,493 | B2 * | 11/2006 | Masuda | 438/618 |
| 2007/0052067 | A1 * | 3/2007 | Umemoto | 257/587 |
| 2008/0251932 | A1 | 10/2008 | Arana | |
| 2009/0321796 | A1 * | 12/2009 | Inohara | 257/288 |
| 2010/0230818 | A1 * | 9/2010 | Birner et al. | 257/751 |

* cited by examiner

*Primary Examiner* — Thanh Nguyen
(74) *Attorney, Agent, or Firm* — Winston Hsu; Scott Margo

(57) ABSTRACT

A through substrate via having a low stress is provided. The through substrate via is positioned in a substrate. The through substrate via includes: an outer tube penetrating the substrate; at least one inner tube disposed within the outer tube; a dielectric layer lining on a side wall of the outer tube, and a side wall of the inner tube; a strength-enhanced material filling the inner tube; and a conductive layer filling the outer tube.

7 Claims, 7 Drawing Sheets

… (1)

SEMICONDUCTOR DEVICE WITH THROUGH SUBSTRATE VIA

BACKGROUND OF THE INVENTION

1. Field of the Invention

The present invention relates to interconnection technologies within semiconductor chips, especially to semiconductor devices with Through-Silicon-Via (TSV).

2. Description of the Prior Art

Since the invention of integrated circuits, the semiconductor industry has experienced continuous rapid growth due to constant improvements in the integration density of various electronic components. For the most part, this improvement in integration density has come from repeated reductions in the minimum feature size, allowing more components to be integrated into chips.

One method of scaling down includes three-dimensional stacking of chips used to form a stacked integrated circuit package. Three-dimensional (3-D) die stacking increases integration density and chip functionality by vertically integrating two or more dice. 3-D integration also improves interconnect speed by decreasing interconnect wire length, and reduces power dissipation and crosstalk.

Therefore, the Through-Silicon-Via (TSV) connection is developed to use in forming interconnects for stacked wafers, stacked chip, and/or combinations thereof for 3-D packaging technologies. TSV is created through a substrate (e.g. wafer), by forming a via extending from a front surface to a back surface of the substrate, and filling the via with a conductive material. Generally the conductive material is copper.

Copper has a coefficients of thermal expansion (CTE) of approximately $16.5 \times 10^{-6}/K$, and silicon has a CTE of approximately $4.68 \times 10^{-6}/K$. Thus, this CTE mismatch may result in significant stress between the silicon and copper.

Because of the CTE mismatch, under normal operation, a mechanical stress may be induced at a copper-silicon interface when the package undergoes a temperature excursion. The stress may result in numerous problems, including thin-film delamination, cracking of the silicon and reduced transistor performance.

To maintain a mechanical stress resulting from a CTE mismatch for a given temperature excursion, via size may be reduced, spacing between adjacent vias may be increased, or vias may be positioned far from active circuitry. Each of these options may lead to increased chip size, lower density circuits or increased cost per chip.

SUMMARY OF THE INVENTION

In an exemplary embodiment, a semiconductor device with a through substrate via includes: a substrate; and a through substrate via penetrating the substrate, wherein the through substrate via comprises: an outer tube penetrating the substrate; at least one inner tube disposed within the outer tube; a dielectric layer lining on a side wall of the outer tube, and a side wall of the inner tube respectively; a strength-enhanced material filling the inner tube; and a conductive layer filling the outer tube.

In another exemplary embodiment, a method of fabricating a semiconductor device with a through substrate via, includes: providing a substrate; patterning the substrate to form at least one inner tube in the substrate; forming a first dielectric layer on an exposed surface of the inner tube; forming a strength-enhanced material filling the inner tube; patterning the first dielectric layer and the substrate to form an outer tube, wherein the inner tube is surrounded by the outer tube; forming a second dielectric layer on a side wall of the inner tube, and a side wall of the outer tube; and filling the outer tube with a conductive layer.

A novel structure of a through substrate via is provided. The novel structure is composed of the outer tube with a plurality of inner tubes within. The conductive layer for connecting stacked wafers or stacked chips fills up the outer tube. Furthermore, the inner tube is filled with strength-enhanced material for increasing the mechanical strength of the through substrate via. Because of the numerous inner tubes inside the outer tube, the stress formed due to CTE mismatch can be dispersed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 5A:
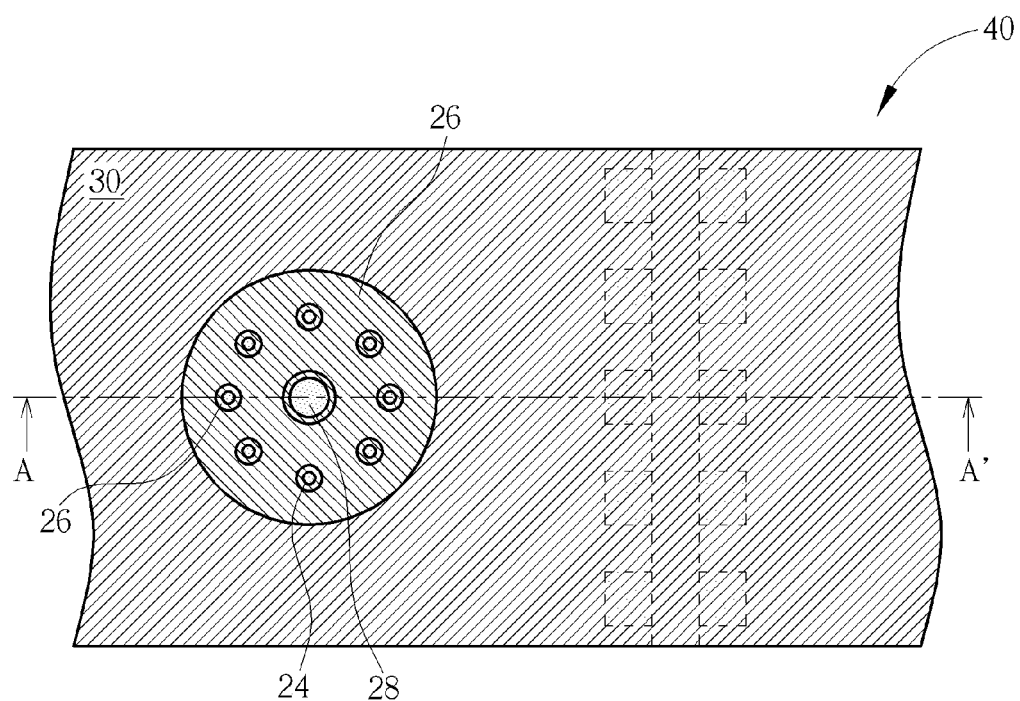
Figure 5B:
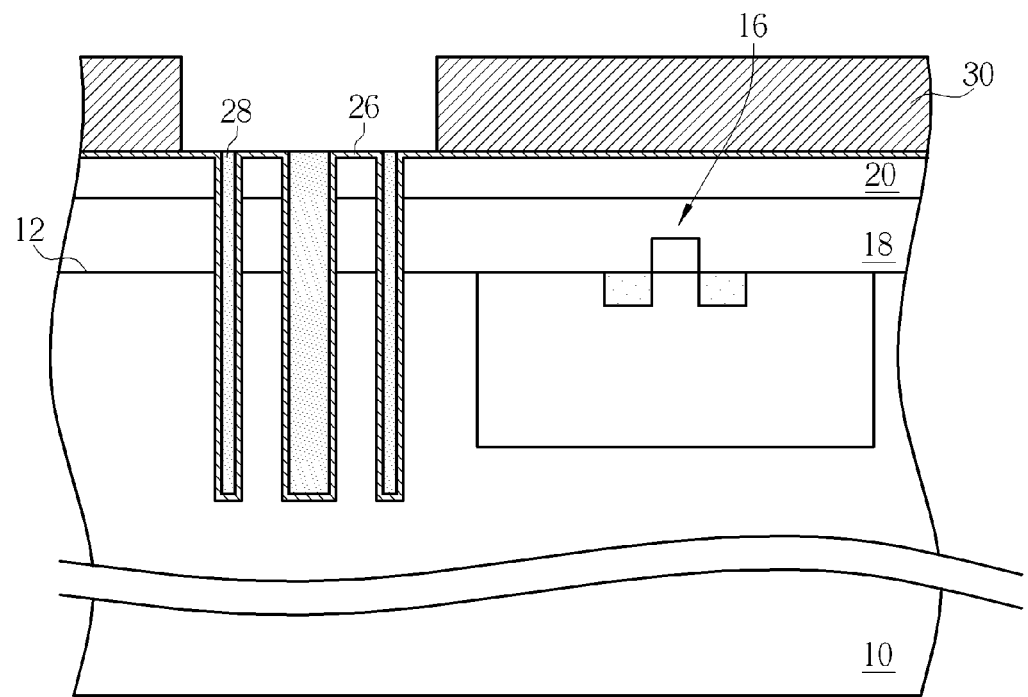
Figure 6A:
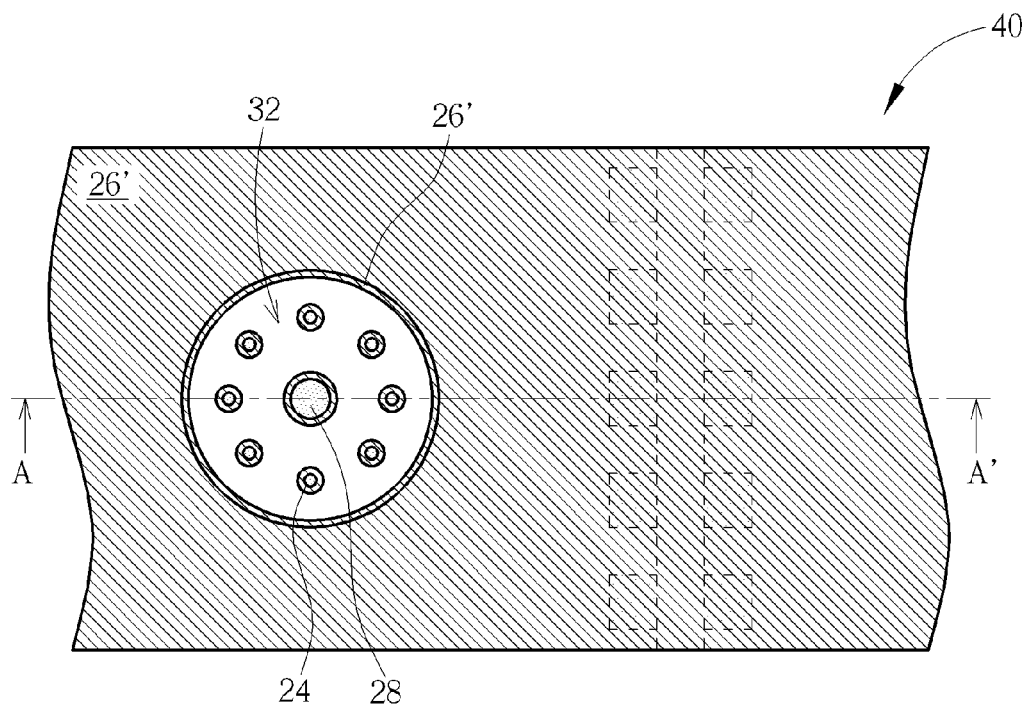
Figure 6B:
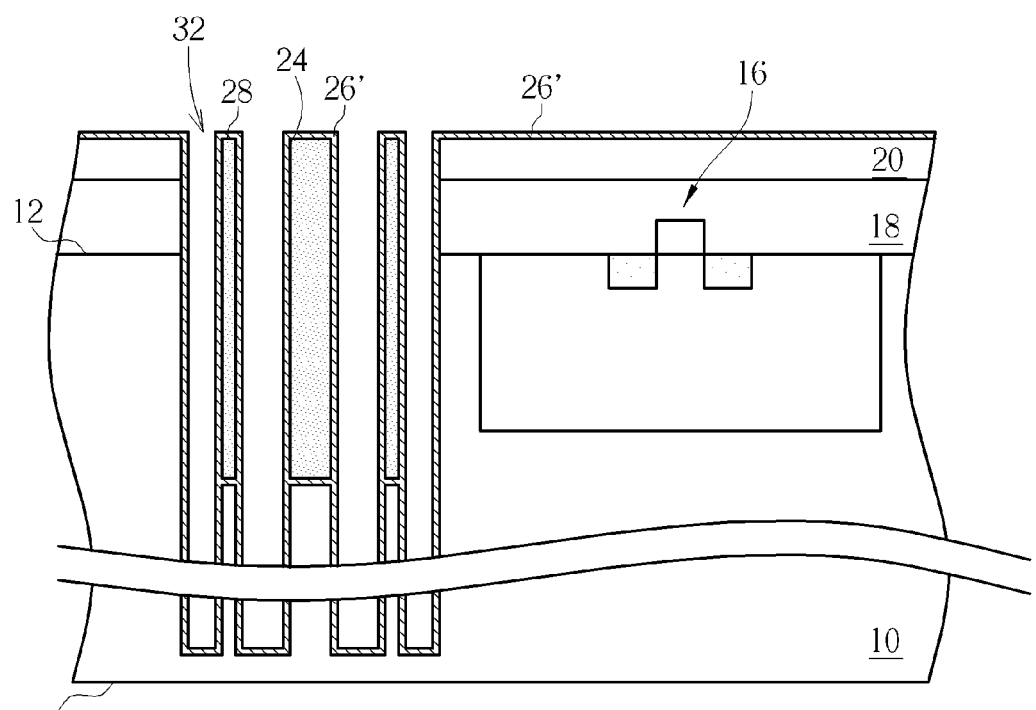
Figure 7A:
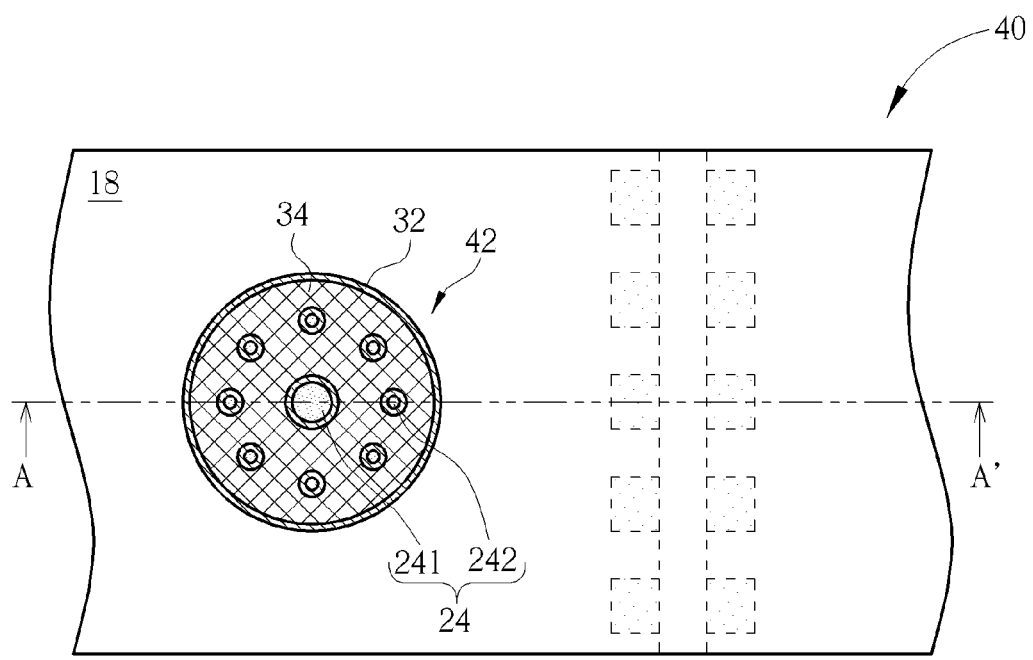
Figure 7B:
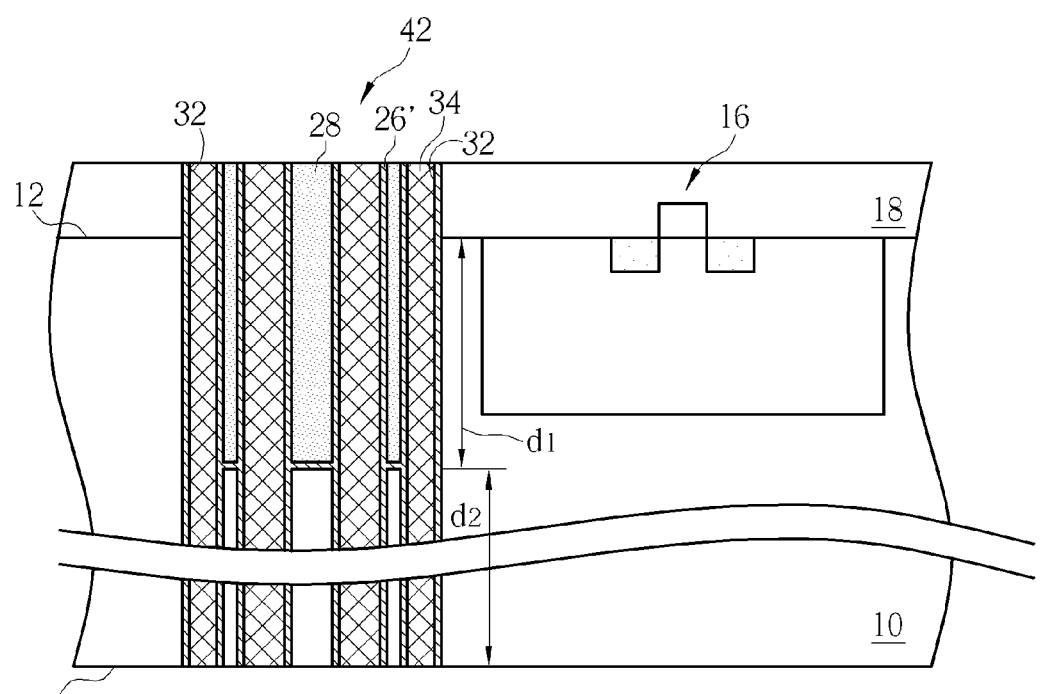
Figure 8:
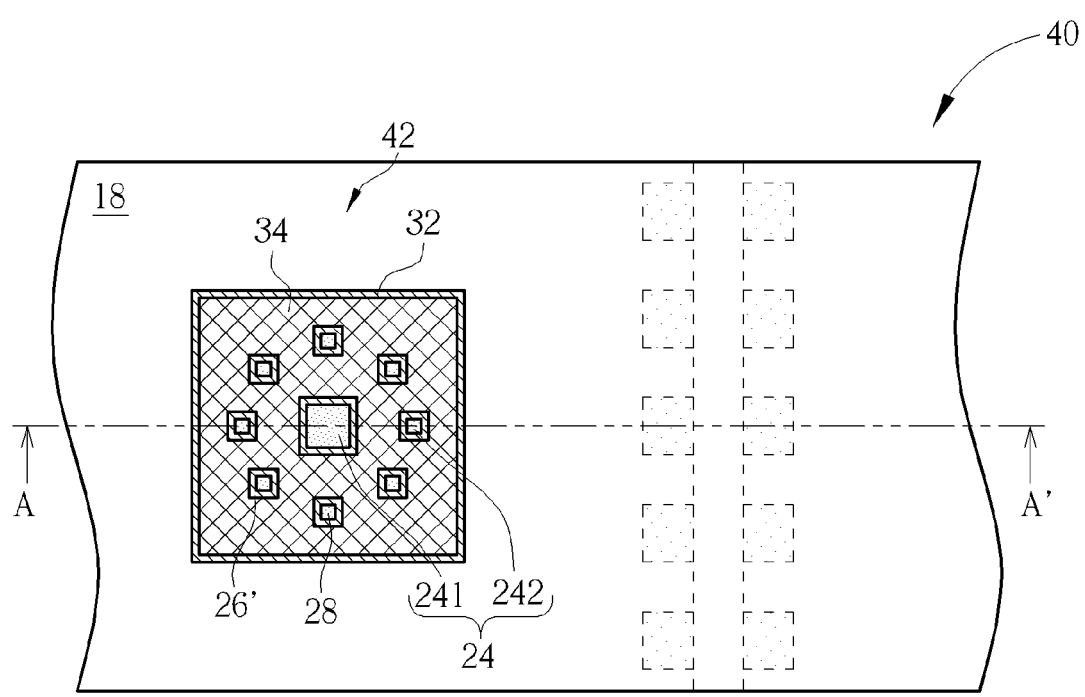
FIG. 8 depicts top view of a semiconductor device with a through substrate via according to another embodiment of the present invention.

FIG. 1 to FIG. 7B depicts an exemplary method of fabricating a semiconductor device with a through substrate via according to a preferred embodiment of the present invention. FIG. 3B is a sectional view of FIG. 3A taken along line AA'. FIG. 5B is a sectional view of FIG. 5A taken along line AA'. FIG. 6B is a sectional view of FIG. 6A taken along line AA'. FIG. 7B is a sectional view of FIG. 7A taken along line AA'. FIG. 8 depicts a top view of a semiconductor device with a through substrate via according to another embodiment of the present invention.

Figure 1:
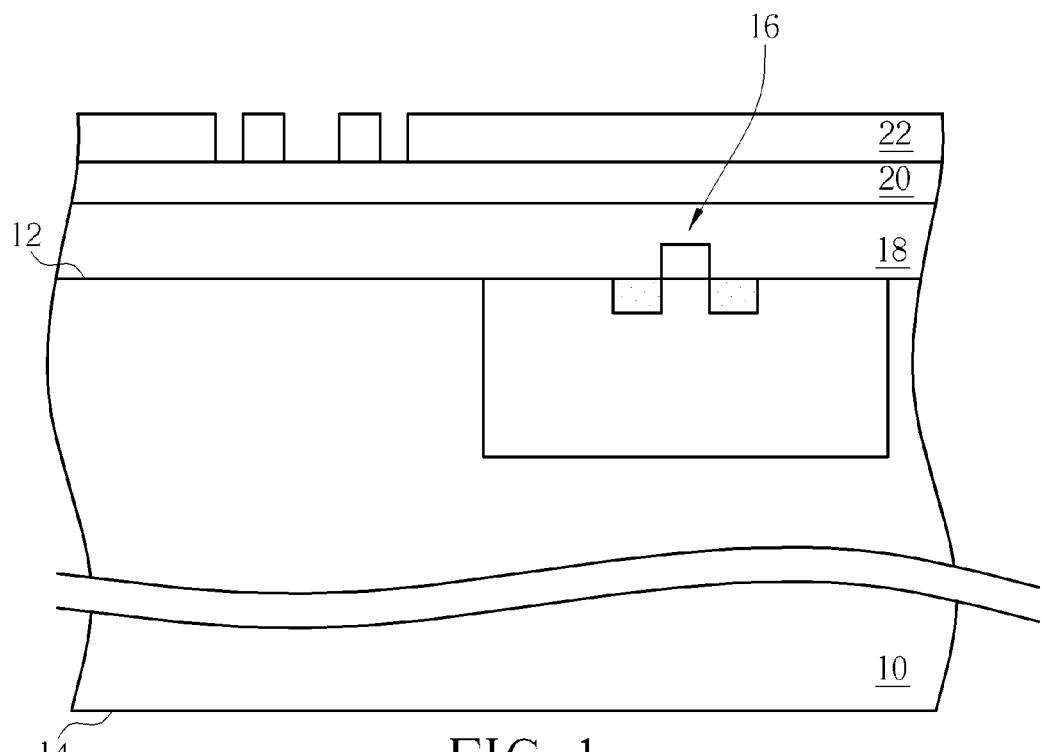
FIG. 1 to FIG. 7B depicts the fabricating method of a semiconductor device with a through substrate via according to a preferred embodiment of the present invention.

As shown in FIG. 1, first, a substrate 10 having a front side 12 and a back side 14 is provided. The substrate 10 may be crystalline semiconductors made from Si, SiGe, Ge, GeAs, AlGaAs, an SOI substrate, a glass substrate, a ceramic substrate, a polymer substrate, or a resin material, etc. The back side 14 of the substrate 10 is depicted facing down in the figure. The front side 12 of the substrate 10 has circuit elements on it. For example, a semiconductor element 16 such as a thin film transistor (TFT), or a MOS device is disposed in and on the front side 12 of the substrate 10. Then, the substrate 10 and the semiconductor device 16 are covered by a dielectric layer 18 and a hard mask 20. The dielectric layer 18 may be an inter metal dielectric (IMD) layer.

Figure 2:
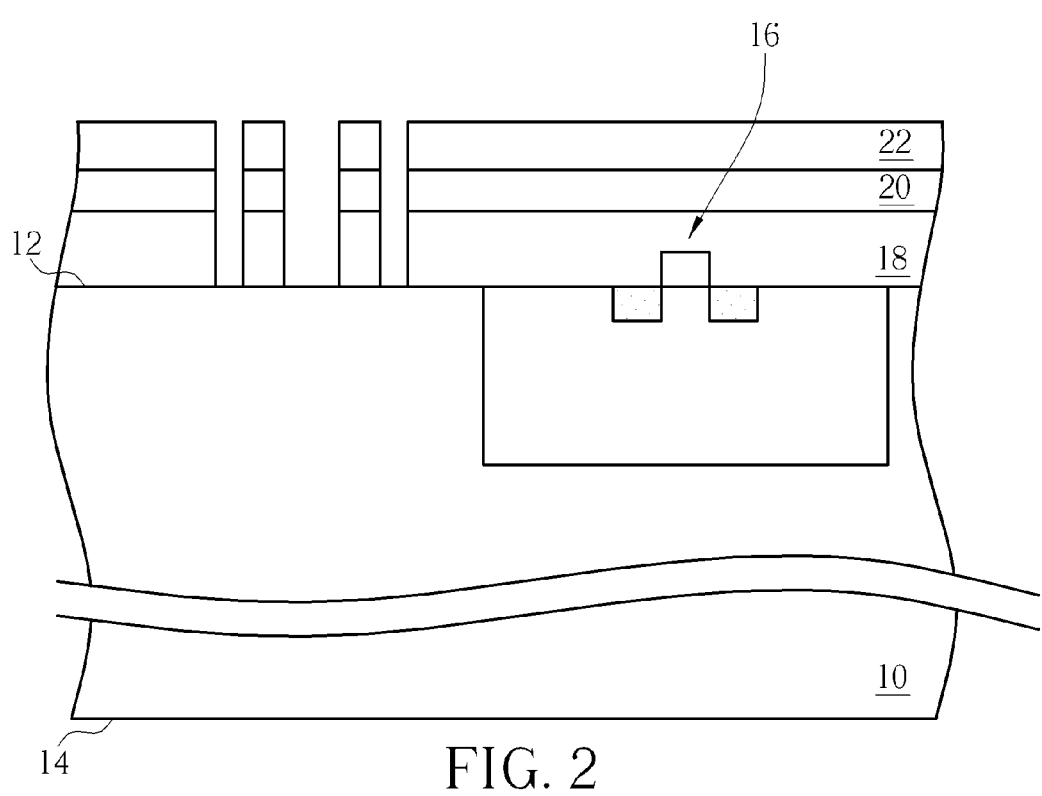

Next, a patterned mask 22 such as a patterned photoresist having at least one inner tube pattern is formed on the hard mask 20. Referring to FIG. 2, later, the hard mask 20 and the dielectric layer 18 are etched by taking the patterned mask 22 as an etching mask. The pattern in the patterned mask 22 is transferred to the hard mask 20 and the dielectric layer 18.

Figure 3A:
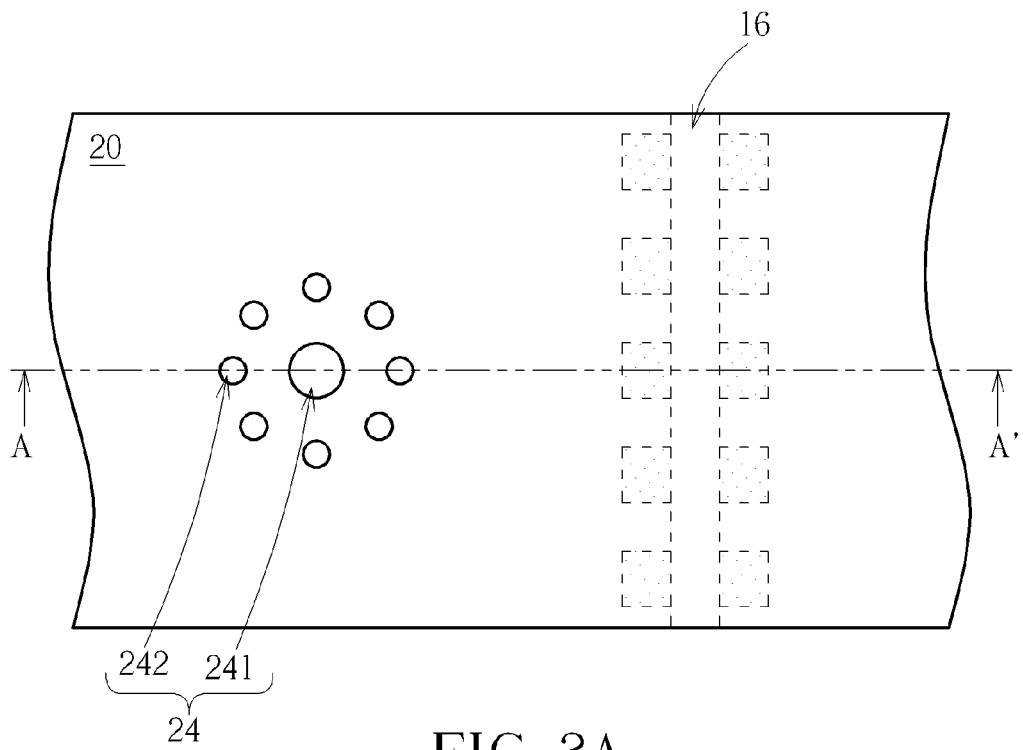
Figure 3B:
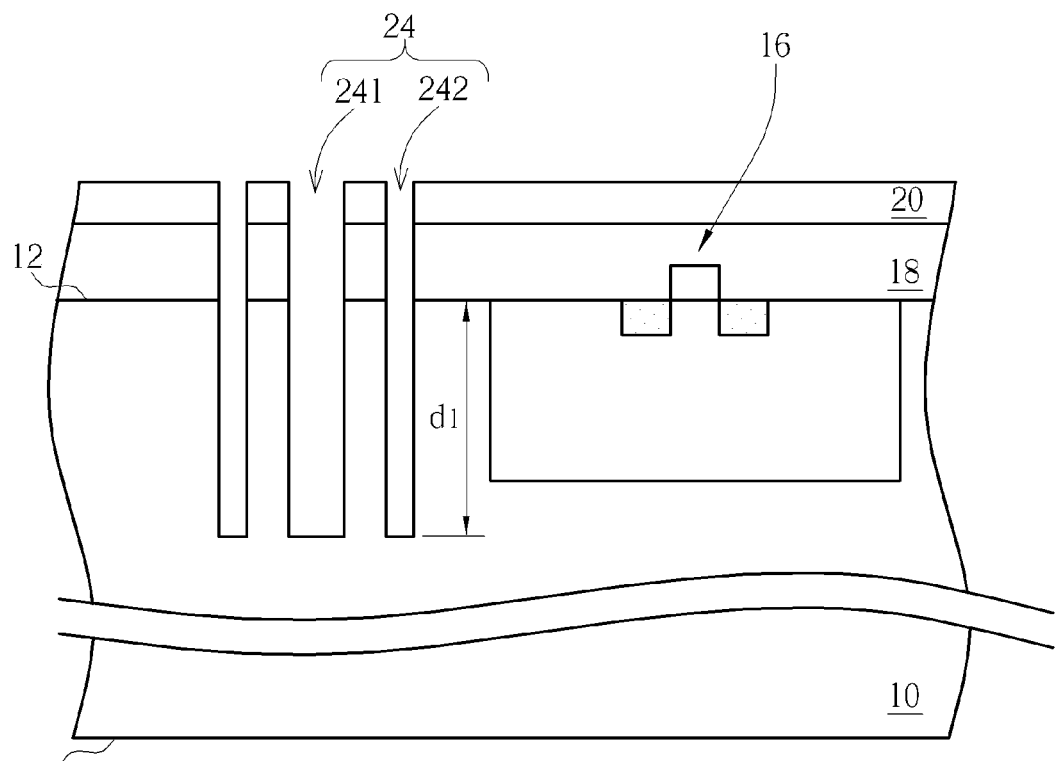

As shown in FIG. 3A and FIG. 3B, the patterned mask 22 is removed. Later, the substrate 10 is etched to form at least one inner tube 24 in the substrate 10 by taking the hard mask 20 and the dielectric layer 18 as a mask. As set forth in FIG. 3A, nine inner tubes 24 are showed for illustration purposes. However, based on different requirements, the number of the inner tubes 24 can be adjusted depending on different requirements. Moreover, the size of the inner tubes 24 may be different. For example, among all the inner tubes 24, the inner tube 241 surrounded by other inner tubes 242 can be the largest. It is noteworthy that the lower end of each of the inner tubes 24 has a distance d1 lower than the front side 12 of the substrate 10. The distance d1 is advantageously 1 μm to 7 μm. However, the distance d1 may be adjusted based on different product requirements. Furthermore, the inner tubes 24 do not penetrate the substrate 10. It should be understood that the shape of the inner tubes 24 is not limited to cylinder, other shapes such as trihedron, tetrahedron, pentahedron and hexahedron can be employed to the inner tubes 24.

Figure 4:
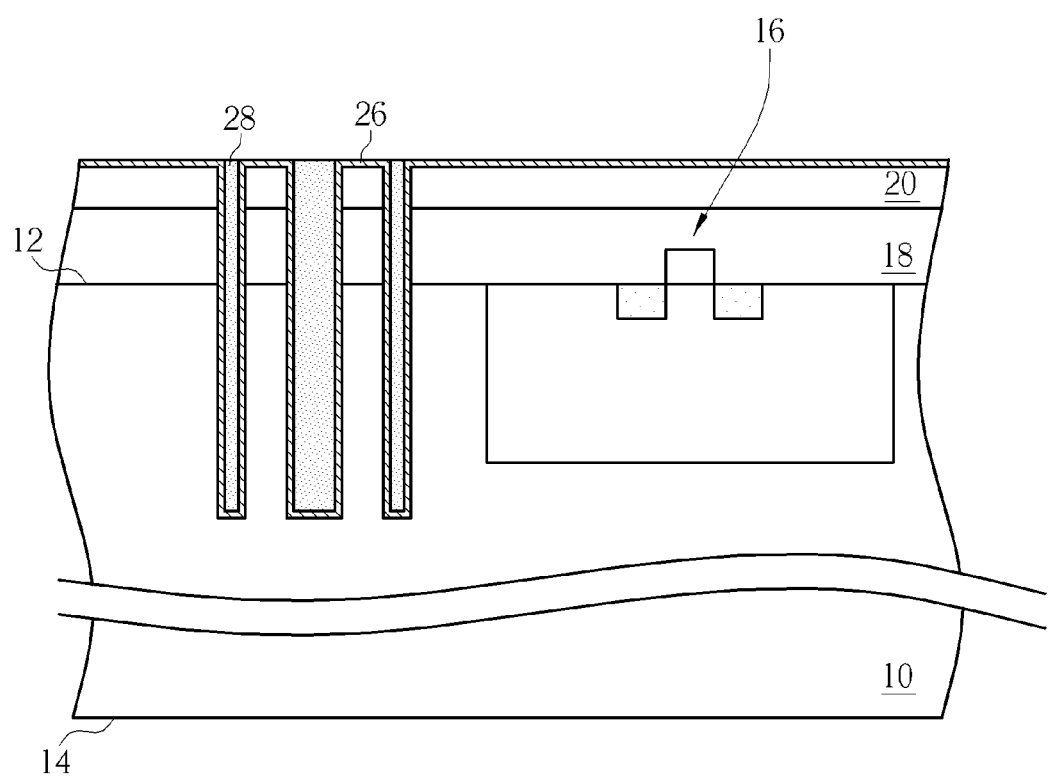

As shown in FIG. 4, a dielectric layer 26 such as silicon oxide or silicon nitride is formed on the side wall of each of the inner tubes 24, and the top surface of the hard mask 20. In this embodiment, the dielectric layer 26 is preferably silicon oxide formed by a chemical vapor deposition (CVD) or atomic layer deposition (ALD) process. After that, a strength-enhanced material 28 such as silicon oxide or silicon nitride is formed to fill up each of the inner tubes 24. Excess strength-enhanced material 28 above the dielectric layer 26 may be removed by chemical mechanical polishing (CMP). The strength-enhanced material 28 is preferably silicon nitride. However, other materials can be utilized to form the strength-enhanced material 28, as long as the material of the strength-enhanced material 28 is different from that of the dielectric layer 26.

As shown in FIGS. 5A and 5B, a patterned mask 30 such as a patterned photoresist layer is formed to cover part of the dielectric layer 26. The inner tubes 24 and the strength-enhanced material 28 inside the inner tubes 24, the dielectric layer 26 between each of the inner tubes 24, the dielectric layer 26 around the inner tubes 24 are exposed through the patterned mask 30.

As shown in FIGS. 6A and 6B, an etching process is performed by taking the patterned mask 30, the strength-enhanced material 28 as an etching mask to remove the dielectric layer 26, the hard mask 20, the dielectric layer 18 and the substrate 10 so as to form an outer tube 32 surrounding the numerous inner tubes 24. The shape of the outer tube 32 is not limited to cylinder, other shapes such as trihedron, tetrahedron, pentahedron and hexahedron can be employed to the outer tube 32. Then, the patterned mask 30 is removed. Next, a thermal oxidation process or a deposition process is performed to form a dielectric layer 26' on the sidewall of each of the inner tubes 24, and the sidewall of the outer tube 32 and the top surface of the hard mask 20. The dielectric layer 26' is preferably silicon oxide. However, other dielectric materials can be utilized to form the dielectric layer 26', as long as the material of the strength-enhanced material 28 is different from that of the dielectric layer 26'.

Referring to FIGS. 7A and 7B, a conductive layer 34 is formed to fill up the outer tube 32 and covers the outer tube 32, the inner tubes 24, the dielectric layer 26' and the semiconductor element 16. The conductive layer 34 may include copper, tungsten, gold, silver, aluminum or other conductive materials. Moreover, the conductive layer 34 may be a multi-layer structure. For example, the conductive layer 34 may be a copper layer with a seeding layer of copper, or a tungsten layer with a layer of titanium nitride serving as an interface layer. According to a preferred embodiment of the present invention, the conductive layer 34 is advantageously tungsten. Later, a planarization process is performed to remove the conductive layer 34 covered on the dielectric layer 18 by taking the dielectric layer 26' and the hard mask 20 as a stop layer. Therefore, the conductive layer 34, the dielectric layer 26' and the hard mask 20 above the top surface of the dielectric layer 18 are removed. The planarization process may be a chemical mechanical polishing. An etching process or any suitable process may be employed to remove the conductive layer 34 outside of the outer tube 32. At this point, a semiconductor device with a through substrate via 40 is completed. After that, the substrate 10 may be thinned before bonding to another substrate to form a wafer stack. After thinning, the lower end of each of the inner tubes 24 may have a distance d2 distant from the back side 14 of the substrate 10. The distance d2 is preferably 43 μm to 49 μm, but not limited to it. The distance d2 can be altered based on the product size.

According to another preferred embodiment of the present invention, a semiconductor device with a through substrate via 40 is provided. Referring to FIGS. 7A and 7B, a semiconductor device with a through substrate via 40 includes: a substrate 10 having a front side 12 and a back side 14. The back side 14 of the substrate 10 is depicted facing down in the figure. A stress-released through substrate via 42 penetrates the substrate 10. The stress-released through substrate via 42 includes an outer tube 32 penetrating the substrate 10. A least one inner tube 24 is disposed within the outer tube 32. In FIG. 7A, there are nine inner tubes 24 within the outer tube 32. However, it should be understood that the invention is not limited to nine inner tubes illustrated in FIG. 7A. The number of the inner tubes 24 can be adjusted based on different requirements. Furthermore, the size of each of the inner tubes 24 can be adjusted. For example, the inner tube 241 at the center of the outer tube 32 can be larger than other inner tubes 242. A dielectric layer 26' lines on the side wall of the outer tube 32, and the side wall of each of the inner tubes 24 respectively. The dielectric layer 26' may be silicon oxide, silicon nitride or other dielectric materials. In this embodiment, the dielectric layer 26' is preferably silicon oxide. A strength-enhanced material 28 fills up each of the inner tubes 24. The strength-enhanced material 28 may be silicon oxide, silicon nitride or other dielectric materials. But, the strength-enhanced material 28 is preferably silicon nitride. Moreover, the material of the strength-enhanced material 28 should be different from that of the dielectric layer 26'. A conductive layer 34 fills up the outer tube 32. The conductive layer 34 may be copper, tungsten, gold, silver, aluminum or other conductive materials. Preferably, the conductive layer 34 in this embodiment is tungsten.

The lower end of each of the inner tubes 24 has a distance d1 lower than the front side 12 of the substrate 10. The distance d1 is advantageously 1 μm to 7 μm. More specifically, the lower end of each of the inner tubes 24 has distance d2 distant from the back side 14 of the substrate 10. The distance d2 is preferably 43 μm to 49 μm, but not limited to it. The distance d1 is decided basing on the depth of the semiconductor element 16.

The shape of the outer tube 34 and the inner tubes 24 may be cylinder, trihedron, tetrahedron, pentahedron or hexahedron. For example, as shown in FIG. 8, the outer tube 32 and the inner tubes 24 have a shape of tetrahedron.

The feature of the embodiment in the present invention is that there are numerous inner tubes disposed inside the outer tube. The stress arises from CTE mismatch can be distributed onto the numerous inner tubes. Furthermore, the silicon nitride filling within the inner tubes can increase the strength of the top portion of the through substrate via. The top portion of the through substrate via refers to 1~7 μm below the front side of the substrate. Therefore, the semiconductor element near the through substrate via will not be deteriorated by the stress. Moreover, tungsten has a CTE of is approximately 4.5 $10^{-6}$/K, and silicon nitride has a CTE of approximately 3.3 $10^{-6}$/K. As illustrated in the foregoing description, the copper has a CTE of approximately 16.5 $10^{-6}$/K, and silicon has a CTE of approximately 4.68 $10^{-6}$/K. Therefore, the CTE of copper is much greater than that of the silicon. Compared to copper, tungsten has a similar CTE as compared to silicon. Therefore, a through substrate via with tungsten as the conductive layer will have smaller stress generated by CTE mismatch than a through substrate via with copperas the conductive layer. Furthermore, silicon nitride has even smaller CTE than tungsten. As a result, the silicon nitride filling inside the inner tubes merely generate small stress. As a result, the through substrate via described in the foregoing preferred embodiment possesses a structure with low stress generated by the CTE mismatch.

Those skilled in the art will readily observe that numerous modifications and alterations of the device and method may be made while retaining the teachings of the invention.

What is claimed is:

1. A semiconductor device with a through substrate via comprising:
   a substrate; and
   a through substrate via penetrating the substrate, wherein the through substrate via comprises:
   an outer tube penetrating the substrate;
   at least one inner tube disposed within the outer tube;
   a dielectric layer lining on a side wall of the outer tube, and a side wall of the inner tube;
   a strength-enhanced material filling the inner tube; and
   a conductive layer filling the outer tube.

2. The semiconductor device with a through substrate via of claim 1, wherein the dielectric layer is made of material different from that of the strength-enhanced material.

3. The semiconductor device with a through substrate via of claim 2, wherein the dielectric layer comprises silicon oxide or silicon nitride.

4. The semiconductor device with a through substrate via of claim 3, wherein the strength-enhanced material comprises silicon oxide or silicon nitride.

5. The semiconductor device with a through substrate via of claim 1, wherein the conductive layer comprises tungsten or copper.

6. The semiconductor device with a through substrate via of claim 1, wherein the outer tube has a shape selected from the group consisting of cylinder, trihedron, tetrahedron, pentahedron and hexahedron.

7. The semiconductor device with a through substrate via of claim 1, wherein the inner tube has a shape selected from the group consisting of cylinder, trihedron, tetrahedron, pentahedron and hexahedron.

* * * * *